US009263574B1

(12) United States Patent
Kumar et al.

(10) Patent No.: US 9,263,574 B1
(45) Date of Patent: Feb. 16, 2016

(54) SEMICONDUCTOR DEVICE AND METHOD FOR FABRICATING THE SAME

(71) Applicant: Vanguard International Semiconductor Corporation, Hsinchu (TW)

(72) Inventors: Manoj Kumar, Dhanbad (IN); Pei-Heng Hung, New Taipei (TW); Chia-Hao Lee, New Taipei (TW); Chih-Cherng Liao, Jhudong Township (TW); Shang-Hui Tu, Jhubei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 14/535,793

(22) Filed: Nov. 7, 2014

(51) Int. Cl.

| | |
|---|---|
| ***H01L 29/78*** | (2006.01) |
| ***H01L 29/66*** | (2006.01) |
| ***H01L 21/336*** | (2006.01) |
| ***H01L 29/10*** | (2006.01) |
| ***H01L 29/06*** | (2006.01) |
| ***H01L 29/49*** | (2006.01) |
| ***H01L 21/02*** | (2006.01) |
| ***H01L 21/28*** | (2006.01) |

(52) U.S. Cl.
CPC ...... *H01L 29/7816* (2013.01); *H01L 21/02164* (2013.01); *H01L 21/28035* (2013.01); *H01L 29/0634* (2013.01); *H01L 29/0642* (2013.01); *H01L 29/1095* (2013.01); *H01L 29/4916* (2013.01); *H01L 29/66659* (2013.01); *H01L 29/66681* (2013.01); *H01L 29/7835* (2013.01)

(58) Field of Classification Search
CPC ............ H01L 29/7835; H01L 29/0634; H01L 29/7816; H01L 29/66659; H01L 29/66681; H01L 29/0847
See application file for complete search history.

(56) References Cited

U.S. PATENT DOCUMENTS 5,981,997 A * 11/1999 Kitamura ............ H01L 29/0847 257/335
6,424,007 B1 * 7/2002 Disney ............ H01L 21/823418 257/104
6,475,870 B1 * 11/2002 Huang ................ H01L 29/1083 257/E29.063
7,986,004 B2 * 7/2011 Ohdaira .............. H01L 29/0847 257/335
8,704,300 B1 * 4/2014 Lin ................... H01L 29/66659 257/335
8,969,961 B2 * 3/2015 Park .................... H01L 29/0634 257/342
2001/0000288 A1 * 4/2001 Oh ...................... H01L 29/0847 257/409
2002/0053695 A1 * 5/2002 Liaw ................... H01L 29/1083 257/328
2006/0057784 A1 * 3/2006 Cai ..................... H01L 29/7835 438/149
2009/0114987 A1 * 5/2009 Tanaka ............ H01L 21/823418 257/335
2010/0295125 A1 * 11/2010 Ito ....................... H01L 29/7835 257/339
2011/0303977 A1 * 12/2011 Huang ................ H01L 21/8249 257/339
2013/0134512 A1 * 5/2013 Cheng ................... H01L 29/402 257/339

* cited by examiner

*Primary Examiner* — Marvin Payen
*Assistant Examiner* — Jeremy Joy
(74) *Attorney, Agent, or Firm* — Birch, Stewart, Kolasch & Birch, LLP

(57) ABSTRACT

A semiconductor device includes a semiconductor layer formed over a semiconductor substrate. A well region is disposed in a portion of the semiconductor layer, and a plurality of first doped regions is disposed in various portions of the well region. A second doped region is disposed in a portion of the well region. An isolation element is disposed in a portion of the top-most one of the first doped regions, and a third doped region is disposed in a portion of the top-most one of the first doped regions. A fourth doped region is disposed in a portion of the second doped region. An insulating layer overlies the third doped region, the isolation element, the second doped region, and the fourth doped region, and a conductive layer overlies the insulating layer.

20 Claims, 5 Drawing Sheets

SEMICONDUCTOR DEVICE AND METHOD FOR FABRICATING THE SAME

BACKGROUND OF THE INVENTION

1. Field of the Invention

The present invention relates to integrated circuit (IC) devices, and in particular to a semiconductor device and a method for fabricating the same.

2. Description of the Related Art

Recently, as demand increases for high-voltage devices, such as power semiconductor devices, there has been an increasing interest in research for high-voltage metal-oxide-semiconductor field effect transistors (HV MOSFETs) applied in high-voltage devices.

Among the various types of high voltage metal-oxide-semiconductor field effect transistors (HV MOSFETs), semiconductor devices such as lateral double diffused metal-oxide-semiconductor (LDMOS) devices are often used.

However, with the trend of size reduction in semiconductor fabrication, the critical size of high-voltage MOSFETs for high-voltage devices needs to be reduced further. Thus, a reliable high-voltage MOSFET for high-voltage devices having a reduced size is needed to meet device performance requirements such as driving currents, on-resistances, and breakdown voltages, as the needs and trends in size reduction of high-voltage devices continue.

BRIEF SUMMARY OF THE INVENTION

An exemplary semiconductor device comprises a semiconductor, a semiconductor layer, a well region, an isolation element, a plurality of first doped regions, a second doped region, a third doped region, a fourth doped region, an insulating layer, and a conductive layer. In one embodiment, the semiconductor substrate has a first conductivity type, and the semiconductor layer is formed over the semiconductor substrate having the first conductivity type. The well region is disposed in a portion of the semiconductor layer, having a second conductivity type opposite to the first conductivity type, and the plurality of first doped regions are of the first conductivity type and are vertically and separately disposed in various portions of the well region. The second doped region is of the second conductivity type and is disposed in a portion of the well region, wherein the second doped region is adjacent to the first doped regions. The isolation element is disposed in a portion of the top-most one of the first doped regions, and a third doped region is of the first conductivity type and is disposed in a portion of the top-most one of the first doped regions, being adjacent to the isolation element. The fourth doped region is of the first conductive type and is disposed in a portion of the second doped region. The insulating layer overlies a portion of the third doped region, the isolation element, a portion of the second doped region, and a portion of the fourth doped region, and the conductive layer overlies a portion of the insulating layer.

An exemplary method for fabricating a semiconductor device comprises providing a semiconductor substrate, having a first conductivity type and forming a semiconductor layer formed over the semiconductor substrate, having the first conductivity type. A well region is formed in a portion of the semiconductor layer, having a second conductivity type opposite to the first conductivity type, and an isolation element is formed in a portion of the well region. A plurality of first doped regions of the first conductivity type is vertically and separately disposed in various portions of the well region, wherein the isolation element is disposed in a portion of the top-most one of the first doped regions. A second doped region of the second conductivity type is formed in a portion of the well region, wherein the second doped region is adjacent to the first doped regions. A third doped region of the first conductive type is formed in a portion of the top-most one of the first doped regions, being adjacent to the isolation element. A fourth doped region of the first conductivity type is formed in a portion of the second doped region. An insulating layer is formed over a portion of the third doped region, the isolation element, a portion of the second doped region, and a portion of the fourth doped region, and a conductive layer is formed to overlie a portion of the insulating layer.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
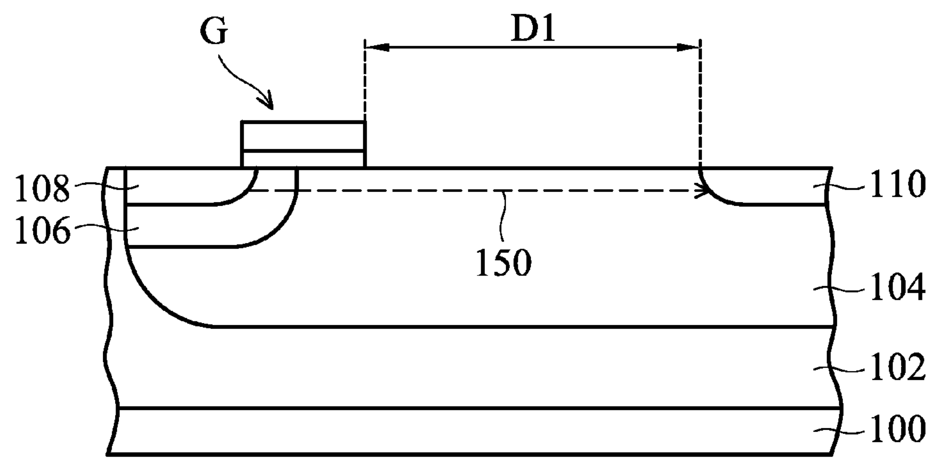
FIG. 1 is schematic cross section of a lateral double diffused metal-oxide-semiconductor (LDMOS) device according to an embodiment of the invention.

FIG. 1 illustrates a schematic cross section of an exemplary lateral double diffused metal-oxide-semiconductor (LDMOS) device applicable in a high-voltage device.

As shown in FIG. 1, the LDMOS device mainly comprises a P-type semiconductor substrate 100, an N-type well region 102 formed in a portion of the P-type semiconductor substrate 100, and a $P^-$-type drift region 104 formed in a portion of the N-type well region 102. In addition, the LDMOS device shown in FIG. 1 further comprises a gate structure G formed over a portion of the $P^-$-type drift region 104, an N-type doped region 106 disposed in a portion of the $P^-$-type drift region 104 under the gate structure G at the left side of the gate structure G. A $P^+$-type doped region 108 is disposed in a portion of the $N^-$-type doped region 106 and under a portion of the gate structure G to partially contact a portion of the gate stack G, thereby functioning as a source region of the LDMOS device, and another $P^+$-type doped region 110 is disposed in a portion of the $P^-$-type drift region 104 at the right side of gate stack G to function as a drain region of the LDMOS device. During operation of the LDMOS shown in FIG. 1, currents (not shown) may mainly flow from the source region (e.g. the $P^+$-type doped region 108) to the drain region (e.g. the $P^+$-type doped region 110) through a lateral path 150 shown in FIG. 1.

In the LDMOS device shown in FIG. 1, a predetermined distance D1 is kept between the gate structure G and the $P^+$-type doped region 110 at the right side of the gate structure G to ensure good performance of the LDMOS device. Therefore, the predetermined distance D1 kept between the gate structure G and the P+ type doped region 110 allows for a suitable breakdown voltage of the LDMOS device, but it increases the dimensions of the LDMOS device, which is unfavorable for further reduction of both the fabrication cost and the dimensions of the LDMOS device shown in FIG. 1.

FIGS. 2-8 are schematic cross sections showing an exemplary method for fabricating a lateral double diffused metal-oxide-semiconductor (LDMOS) device applicable in a high-voltage device and providing a suitable breakdown voltage as the size thereof is further reduced.

Figure 2:
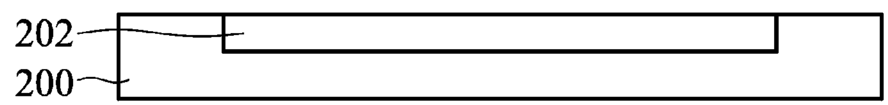
FIGS. 2-8 are schematic cross sections showing a method for fabricating a lateral double diffused metal-oxide-semiconductor (LDMOS) device according to an embodiment of the invention.

In FIG. 2, a semiconductor substrate 200 of a first conductivity type is provided. In one embodiment, the semiconductor substrate 200 can be a P-type semiconductor substrate having a resistivity of about 5-80 ohms-cm (Ω-cm), and may comprise semiconductor materials such as silicon or the like. Next, a doped region 202 of a second conductivity type opposite to the first conductivity type is formed in a portion of the semiconductor substrate 200 by using a suitable patterned mask layer and an ion implantation process (both not shown). In one embodiment, the doped region 202 can be an N-type doped region and may have a dopant concentration of about 1e17-5e18 atoms/$cm^3$.

Figure 3:
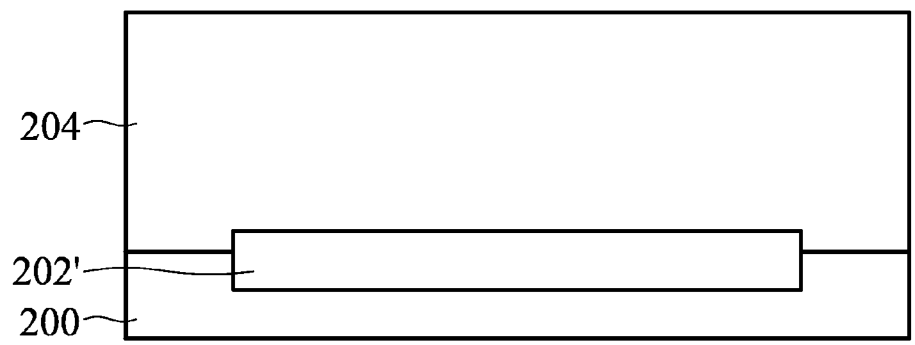

In FIG. 3, a semiconductor layer 204 of the first conductivity type is next formed over the semiconductor substrate 200, and an annealing process (not shown) is then performed to diffuse the dopants in the doped region 202 (see FIG. 2) into the semiconductor layer 204 and the semiconductor substrate 200, thereby forming a buried doped region 202' in a portion of the semiconductor layer 204 and a portion of the semiconductor substrate 200 at an interface therebetween. In one embodiment, the semiconductor layer 204 can be a P-type semiconductor layer having a resistivity of about 10-70 ohms-cm (Ω-cm) and can be formed by, for example, an epitaxial process (not shown), and the buried doped region 202' may have a dopant concentration of about 1e17-5e18 atoms/$cm^3$.

Figure 4:
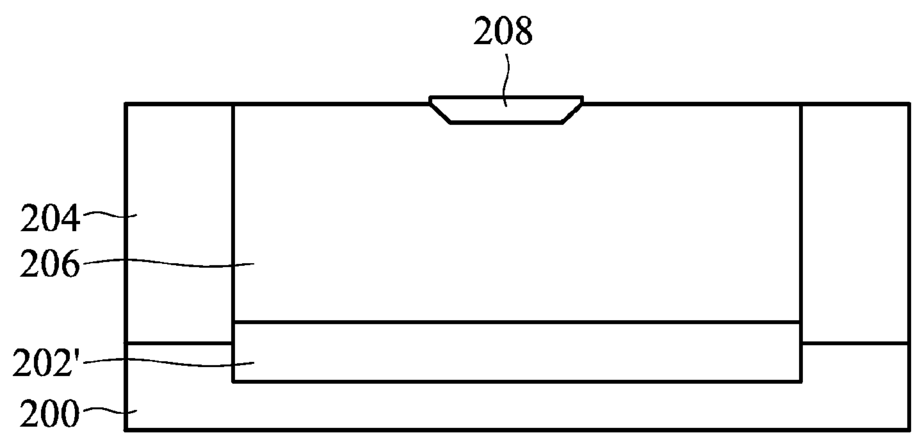

In FIG. 4, a well region 206 is next formed in a portion of the semiconductor layer 204, being disposed over the buried doped region 202', and an isolation element 208 is formed in a portion of the well region 206. In one embodiment, the well region 206 is formed in a portion of the semiconductor layer 204 by using a suitable patterned mask layer and an ion implantation process (both not shown) and may have the second conductivity type and a dopant concentration of about 1e15-5e16 atoms/$cm^3$. In another embodiment, the isolation element 208 can be, for example, a field oxide (FOX) element or a shallow trench isolation (STI) element. The isolation element 208 can be formed by conventional FOX and STI fabrication techniques, and may comprise insulating materials such as silicon oxide.

Figure 5:
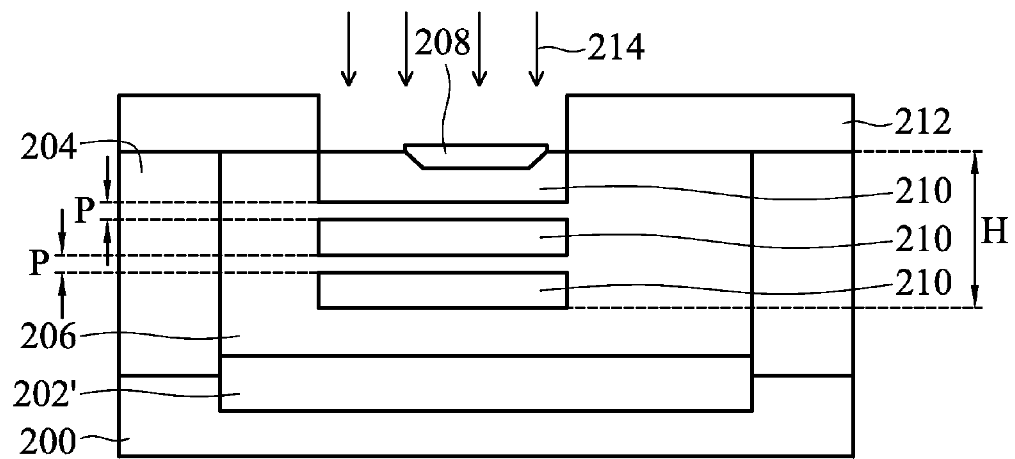

In FIG. 5, a plurality of doped regions 210 of the first conductivity type are next formed in a portion of the well region 206 by using a suitable patterned mask layer 212 and an ion implantation process 214. The patterned mask layer 212 is formed over the semiconductor layer 204 and may comprise materials such as photoresists, so that it can be patterned by a photolithography and an etching process (both not shown) to thereby expose the isolation element 208 and portions of the well region 206 adjacent to the isolation element 208. In one embodiment, in the ion implantation process 214, multiple implantation steps of various energy and dosages are performed to implant dopants of the first conductivity type into the well region 206, thereby vertically and separately forming the plurality of doped regions 210 of the first conductivity type in the well region 206. As shown in FIG. 5, three doped regions 210 are illustrated and separately formed in the well region 206 from the top to the bottom thereof. In one embodiment, the bottom-most dope region 210 may have a dopant concentration greater than the other doped regions 210, and the middle one of the doped regions 210 may have a dopant concentration not less than the top-most doped region 210. In one embodiment, the dosage for forming the bottom-most dope region 210 is about 5e15-1e17 atoms/$cm^3$, and the dosage for forming the middle and top-most doped regions 210 is about 1e15-1e17 atoms/$cm^3$ or less. The bottom surface of the bottom-most doped region 210 may have a depth H of, for example, about 2-5 μm to a top surface of the semiconductor layer 204. The pitch P between the adjacent doped regions 210 can be, for example, about 0.2-0.7 μm, and the pitch P between every two of the adjacent doped regions 210 can be the same or different. The doping energy for forming the bottom-most doped region 210 can be, for example, about 1800-4000 KeV, and the doping energy for forming the middle and top-most doped regions 210 is about 500-2000 KeV and 40-350 KeV, respectively. The number of the doped regions 210 formed in the well region 206 is not limited to that shown in FIG. 5 and can be reduced or increased according to the design of the LDMOS device. In addition, the locations of the doped regions 210 formed in the well region 206 is not limited to that shown in FIG. 5 and can be formed lower or upper according to the design of the LDMOS device.

Figure 6:
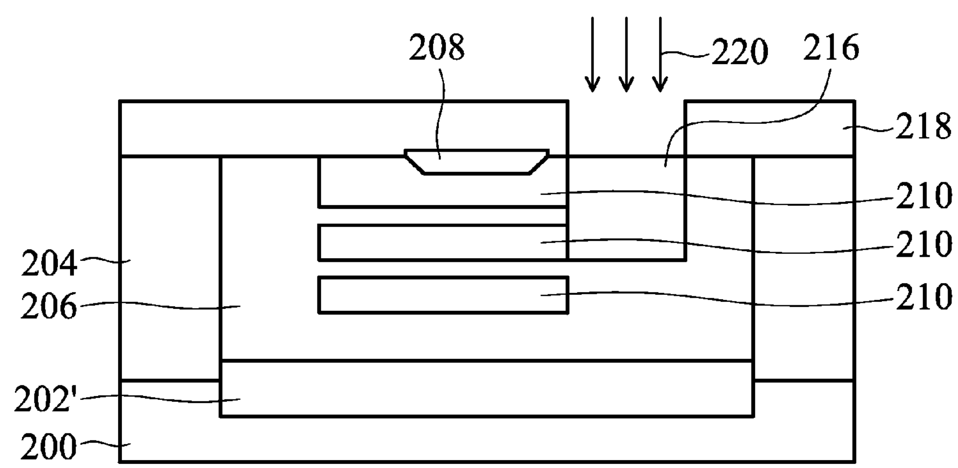

In FIG. 6, after removal of the patterned mask layer 212 shown in FIG. 5, a doped region 216 of the second conductivity type is next formed in a portion of the well region 206 by using a suitable patterned mask layer 218 and an ion implantation process 220. The patterned mask layer 218 is formed over the semiconductor layer 204 and may comprise materials such as photoresists, such that it can be patterned by a photolithography and an etching process (both not shown) to expose a portion of the well region 206 adjacent to a side (e.g. the right side) of the isolation element 208 and the doped regions 210. In one embodiment, in the ion implantation process 216, energy of about 50-500 KeV, and a dosage of about 1e17-5e18 atoms/$cm^3$ are used to implant dopants of the second conductivity type, thereby forming the doped region 216 of the second conductivity in the well region 206. As shown in FIG. 6, the doped region 216 is adjacent to the isolation element 208 and the doped region 210.

Figure 7:
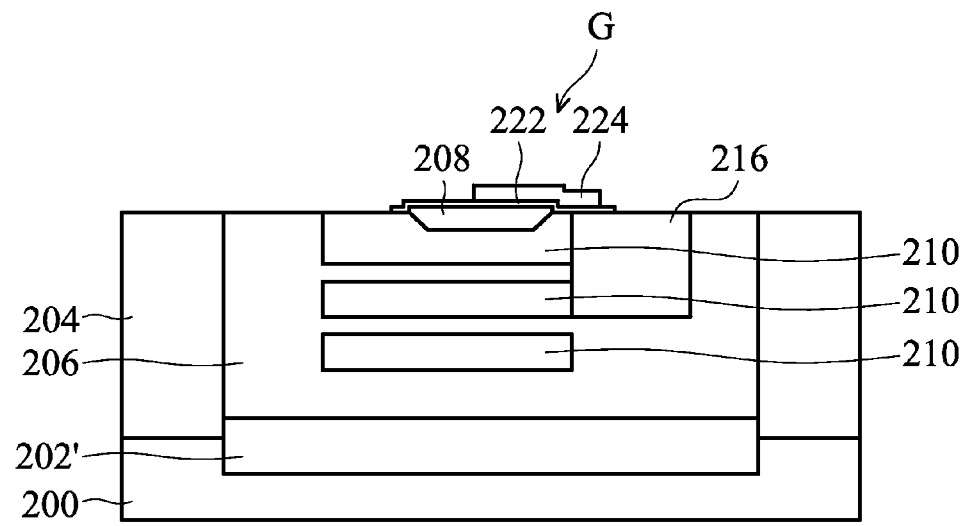

In FIG. 7, after removal of the patterned mask layer 218 shown in FIG. 6, an insulating layer 222 is formed over a portion of the semiconductor layer 204 to cover the isolation element 208 and a portion of the top-most doped region 210 and the doped region 216 adjacent to the isolation element 208. A conductive layer 224 is then formed over a portion of the insulating layer 222 to cover a portion of the top-most doped region 210 and a portion of the doped region 216 adjacent to a side (e.g. the right side) of the isolation element 208. The insulating layer 222 may comprise insulating materials such as silicon oxide or the like, and can be formed by, for example, chemical vapor deposition. The conductive layer 224 may comprise conductive material such as polysilicon, silicide or the like, or a combination thereof, and can be formed by, for example, chemical vapor deposition. The conductive layer 224 and the portion of the insulating layer 222 covered by the conductive layer 222 form a gate structure G.

Figure 8:
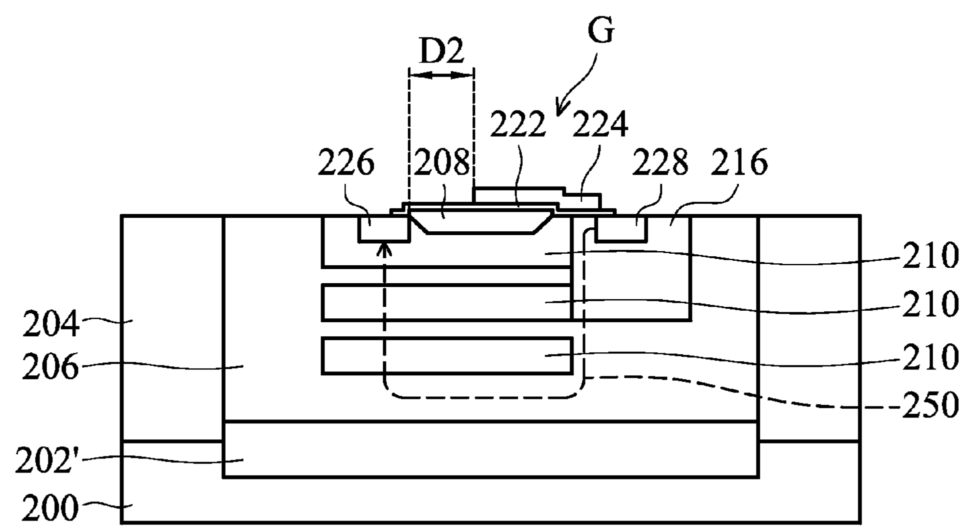

In FIG. 8, a doped region 226 of the first conductivity type is formed in a portion of the semiconductor layer 204 in the topmost doped region 210 at a side (e.g. the left side) of the isolation element 208, and an another doped region 228 of the first conductivity is formed in a portion of the doped region 216 at a side opposite to the isolation element 208 by using a suitable patterned mask layer and an ion implantation process (both not shown). The doped regions 226 and 228 may have a dopant concentration of about 1e18-5e19 atoms/$cm^3$. Therefore, an exemplary semiconductor device applicable for functioning as, for example, a lateral double diffused metal-oxide-semiconductor (LDMOS) device used in high-voltage devices is substantially fabricated, as shown in FIG. 8, and the doped region 226 may function as a drain region and the doped region 228 may function as a source region.

In one embodiment, the first conductivity type is P-type and the second conductivity type is N-type, such that the semiconductor device shown in FIG. 8 may function as a P-type lateral double diffused metal-oxide-semiconductor (PLDMOS) device.

In this embodiment, during the operation of the semiconductor device shown in FIG. 8, currents may flow from the source side (e.g. the doped region 228) laterally and vertically through a path 250 under the gate structure and toward the source side (e.g. the doped region 226). In addition, due to the formation of the doped regions 210 that are formed vertically and separately, the pitch D2 between the gate structure and the source region (e.g. the doped region 226) of the semiconductor device shown in FIG. 8 can be reduced without affecting the breakdown voltage thereof. The pitch D2 can be less than the pitch D1 shown in FIG. 1, such that the semiconductor device shown in FIG. 8 can be provided with a further reduced size.

Figure 9:
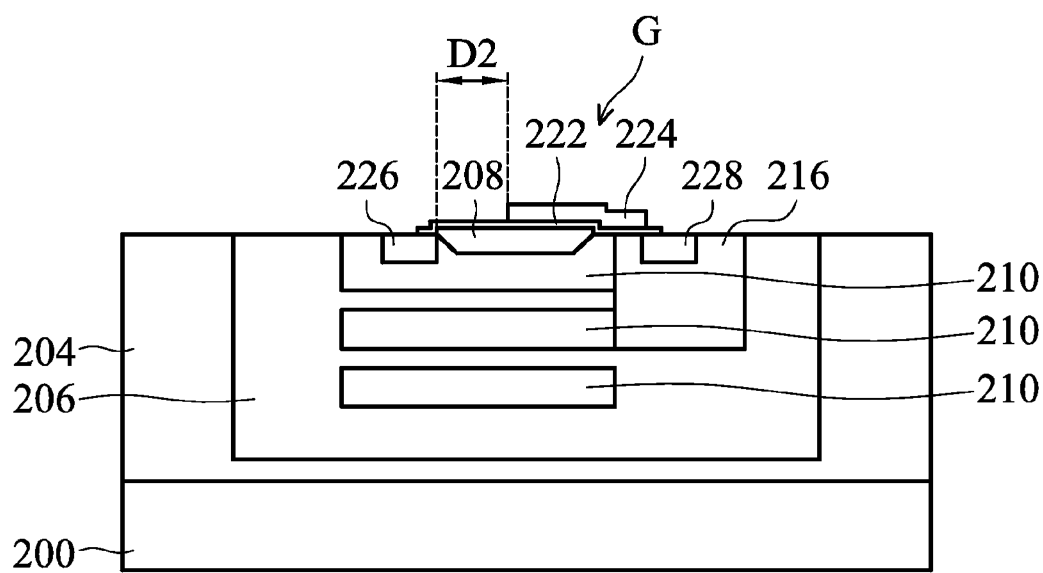
FIG. 9 is schematic cross section of a lateral double diffused metal-oxide-semiconductor (LDMOS) device according to another embodiment of the invention.

FIG. 9 is schematic cross section of another exemplary lateral double diffused metal-oxide-semiconductor (LDMOS) device applicable in a high-voltage device and providing a suitable breakdown voltage as the size thereof is further reduced.

As shown in FIG. 9, the LDMOS device is modified from that shown in FIG. 8 and the buried doped region 202' of the second conductivity type shown in FIG. 8 no longer exists in FIG. 9, and the semiconductor layer 204 can be a part of the semiconductor substrate 200, for example a part of a bulk silicon substrate. The LDMOS device shown in FIG. 9 can be fabricated by the method shown in FIGS. 2-8 by omitting the processes for forming the buried doped region 202' shown in FIGS. 1-2. The components of the LDMOS device that are shown in FIG. 9 the same as those shown in the LDMOS of in FIG. 8 are labeled with the same reference numbers and are not described again here in detail.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:

a semiconductor substrate, having a first conductivity type;

a semiconductor layer formed over the semiconductor substrate, having the first conductivity type;

a well region disposed in a portion of the semiconductor layer, having a second conductivity type opposite to the first conductivity type;

a plurality of first doped regions of the first conductivity type vertically and separately disposed in various portions of the well region, wherein a pitch is between the adjacent first doped regions;

a second doped region of the second conductivity type disposed in a portion of the well region, wherein the second doped region is adjacent to the first doped regions;

an isolation element disposed in a portion of the top-most one of the first doped regions;

a third doped region of the first conductivity type disposed in a portion of the top-most one of the first doped regions, being adjacent to the isolation element;

a fourth doped region of the first conductivity type disposed in a portion of the second doped region;

an insulating layer overlying a portion of the third doped region, the isolation element, a portion of the second doped region, and a portion of the fourth doped region; and a conductive layer overlying a portion of the insulating layer.

2. The semiconductor device as claimed in claim 1, wherein the first conductivity type is P type and the second conductivity type is N type.

3. The semiconductor device as claimed in claim 1, wherein the third doped region is a drain region, and the fourth doped region is a source region.

4. The semiconductor device as claimed in claim 1, wherein the conductive layer and a portion of the insulating layer under the conductive layer form a gate structure.

5. The semiconductor device as claimed in claim 1, wherein the first doped regions have various dopant concentrations.

6. The semiconductor device as claimed in claim 5, wherein a bottom-most region of the first doped regions has a dopant concentration greater than that of the top-most region of the first doped regions.

7. The semiconductor device as claimed in claim 6, wherein the bottom-most region of the first doped regions is about 2-5 μm to a top surface of the semiconductor layer.

8. The semiconductor device as claimed in claim 5, wherein the pitch of about 0.2-0.7 μM is between the adjacent first doped regions.

9. The semiconductor device as claimed in claim 1, further comprising a buried doped region of the second conductivity type disposed in a portion of the semiconductor layer and the semiconductor substrate, wherein the buried doped region is under the well region.

10. The semiconductor device as claimed in claim 1, wherein the conductive layer comprises polysilicon, and the insulating layer comprises silicon oxide.

11. A method for fabricating a semiconductor device, comprising:

providing a semiconductor substrate, having a first conductivity type;

forming a semiconductor layer formed over the semiconductor substrate, having the first conductivity type;

forming a well region in a portion of the semiconductor layer, having a second conductivity type opposite to the first conductivity type;

forming an isolation element in a portion of the well region;

forming a plurality of first doped regions of the first conductivity type vertically and separately disposed in various portions of the well region, wherein the isolation element is disposed in a portion of the top-most one of the first doped regions and a pitch is between the adjacent first doped regions;

forming a second doped region of the second conductivity type in a portion of the well region, wherein the second doped region is adjacent to the first doped regions;

forming a third doped region of the first conductivity type in a portion of the top-most one of the first doped regions, being adjacent to the isolation element;

forming a fourth doped region of the first conductivity type in a portion of the second doped region;

forming an insulating layer over a portion of the third doped region, the isolation element, a portion of the second doped region, and a portion of the fourth doped region; and forming a conductive layer overlying a portion of the insulating layer.

12. The method as claimed in claim 11, wherein the first conductivity type is P type and the second conductivity type is N type.

13. The method as claimed in claim 11, wherein the third doped region is a drain region, and the fourth doped region is a source region.

14. The method as claimed in claim 11, wherein the conductive layer and a portion of the insulating layer under the conductive layer form a gate structure.

15. The method as claimed in claim 11, wherein the first doped regions have various dopant concentrations.

16. The method as claimed in claim 15, wherein a bottom-most region of the first doped regions has a dopant concentration greater than that of the top-most region of the first doped regions.

17. The method as claimed in claim 16, wherein the bottom-most region of the first doped regions is about 2-5 μm to a top surface of the semiconductor layer.

18. The method as claimed in claim 15, wherein the pitch of about 0.2-0.7 μm is between the adjacent first doped regions.

19. The method as claimed in claim 11, further comprising forming a buried doped region of the second conductivity type in a portion of the semiconductor layer and the semiconductor substrate, wherein the buried doped region is under the well region.

20. The method as claimed in claim 11, wherein the conductive layer comprises polysilicon, and the insulating layer comprises silicon oxide.

* * * * *